United States Patent [19]
Bhat et al.

[11] Patent Number: 5,302,847
[45] Date of Patent: Apr. 12, 1994

[54] SEMICONDUCTOR HETEROSTRUCTURE HAVING A CAPPING LAYER PREVENTING DELETERIOUS EFFECTS OF AS-P EXCHANGE

[75] Inventors: Rajaram Bhat; Maria J. S. P. Brasil, both of Red Bank; Robert E. Nahory, Lincroft, all of N.J.; William E. Quinn, Boulder, Colo.; Maria C. Tamargo, Plainfield, N.J.

[73] Assignee: Bell Communications Research, Inc., Livingston, N.J.

[21] Appl. No.: 72,634

[22] Filed: Jun. 4, 1993

Related U.S. Application Data

[62] Division of Ser. No. 859,120, Mar. 27, 1992, Pat. No. 5,246,878.

[51] Int. Cl.$^5$ .............................................. H01L 29/20
[52] U.S. Cl. ..................... 257/615; 257/200; 257/22; 257/190
[58] Field of Search ................ 257/615, 200, 22, 190

[56] References Cited

U.S. PATENT DOCUMENTS

| | | | |
|---|---|---|---|
| 4,371,967 | 2/1983 | Wada et al. ............... | 372/45 |
| 4,987,096 | 1/1991 | Ishikawa et al. .......... | 437/129 |
| 4,987,097 | 1/1991 | Nitta et al. ................ | 437/129 |

FOREIGN PATENT DOCUMENTS

| | | | |
|---|---|---|---|
| 364 | 1/1990 | Japan ............................ | 437/96 |
| 2-199875 | 8/1990 | Japan ............................ | 257/615 |

OTHER PUBLICATIONS

M. Razeghi et al., "Extremely high electron mobility in a GaAs-Ga$_x$In$_{1-x}$P heterostructure grown by metalorganic chemical vapor deposition," Applied Physics Letters, 1989, vol. 5, pp. 457-459.

R. Bhat et al., "A novel technique for the preservation of gratings in InP and InGaAsP and for the simultaneous preservation of InP, InGaAs, and InGaAsP in OMCVD," *Journal of Crystal Growth*, 1991, vol. 107, pp. 871-877.

M. J. S. P. Brasil et al., "Arsenic-Phosphorous Exchange During the Formation of InAlAs/InP Interfaces", InP Conference, Apr. 23-24, 1992.

*Primary Examiner*—Robert Limanek
*Attorney, Agent, or Firm*—Leonard Charles Suchyta; James W. Falk

[57] ABSTRACT

A III-V semiconductor heterojunction in which a capping layer (14) is formed between the two layers (10, 16) of the heterojunction to prevent any deleterious effects due to As-P exchange. When InAlAs is grown on InP, the capping layer is AlP. When GaAs is grown on GaInP, the capping layer is GaP.

7 Claims, 2 Drawing Sheets

SEMICONDUCTOR HETEROSTRUCTURE HAVING A CAPPING LAYER PREVENTING DELETERIOUS EFFECTS OF AS-P EXCHANGE

This is a division of application Ser. No. 07/859,120, filed Mar. 27, 1992 now U.S. Pat. No. 5,246,878.

FIELD OF THE INVENTION

The invention relates generally to compound semiconductor devices. In particular, the invention relates to stabilizing an interface of a compound-semiconductor heterostructure including GaAs or InP.

BACKGROUND ART

Many advanced semiconductor electronic and optoelectronic devices are being developed based on the InP family of semiconductors. An example is a fast transistor using InP channels that take advantage of the high saturated electron velocity in InP. In this case, $In_{0.52}Al_{0.48}As$ is grown over an InP substrate or InP epi-layer. The band bending at the InAlAs/InP interface leads to two-dimensional confinement of electrons on the InP side of the interface and of holes on the InAlAs side. Another example is a thin quantum well of InAs grown on an InP barrier and then covered with another InP barrier. The bandgap in the quantum well corresponds to about 1.3 μm of optical energy, a region of great interest for optical fiber communications. In both examples, the interfacial characteristics are crucial because the interesting effects are occurring within a few nanometers of the nominal interface.

Such structures can be grown by a variety of techniques, molecular beam epitaxy (MBE), organo-metallic chemical vapor deposition (OMCVD), or organo-metallic molecular beam epitaxy (OMMBE), which is a combination of the first two and is sometimes referred to as chemical beam epitaxy (CBE). The conventional OMMBE method will be described with reference to an InAs/InP interface. An InP epi-layer is deposited by exposing an InP substrate to a medium pressure of tri-methyl-indium (TMI) by the evaporation of TMI (a solid at room temperature) and to a medium pressure of molecular phosphorus ($P_2$) obtained by cracking phosphine in a cracker cell. The TMI cracks on the hot substrate surface into In which then combines with the arriving $P_2$ to form the desired InP. At the interface, the beam of phosphorus is interrupted and is replaced by a beam of molecular arsenic ($As_2$) from another cracker cell cracking arsine to similarly form the desired InAs. If the second layer is to be composed of InAlAs, tri-isobutyl-aluminum (TIBAl) is supplied by the evaporation of TIBAl (a liquid at room temperature) in a fixed proportion to the TMI. Because the absence of the group-V flux is believed to degrade the surface quality, it is common practice to interrupt the TMI for about two seconds during the switching from $P_2$ to $As_2$ and before supplying the TIBAl in order to assure that the group-V element is not a combination of P and As.

Our experience, however, has shown that the InAs/InP interface is less abrupt than would be expected from the above sequence. We attribute the major part of the poor interface to an exchange between the already grown phosphide with the after supplied As. Indeed, we have grown a layer of InAs that was between 5 and 10 monolayers thick by simply exposing the InP to $As_2$ for eight seconds in the absence of TMI. The thickness though was spatially varying. Such interfacial roughness undesirably scatters electrons, thus limiting device performance. It is possible that such As-P exchange continues after the fabrication of the interface, thereby bringing into question the long-term reliability of a device utilizing such an interface. Obviously, the poor interface abruptness and questionable reliability are not satisfactory.

A similar problem has arisen in GaAs/GaInP heterostructures, which are important for modulation-doped field-effect transistors, heterojunction bipolar transistors, lasers, and solar cells. The alloy $Ga_{0.515}In_{0.485}P$ is lattice matched to GaAs. A two-dimensional electron gas forms on the GaAs side of the heterojunction, as disclosed by Razeghi et al. in "Extremely high electron mobility in a $GaAs-Ga_xIn_{1-x}P$ heterostructure grown by metalorganic chemical vapor deposition", *Applied Physics Letters*, volume 55, 1989, pp. 457–459. In a superlattice configuration, GaAs forms the quantum well. Such GaAs/GaInP heterostructures can be grown by OMMBE, by gas source MBE (GSMBE), or by OMCVD. The latter method is often preferred because of its simplicity, economy, and high throughput. However, changing over the group-V element is known to present a problem. The P cannot be shut off in a cessation of growth during which the chamber is flushed because its high vapor pressure would cause it to evaporate from the already deposited GaInP. Bhat et al. have described the deleterious reaction of arsine and phosphine with underlying III-V materials, especially GaAs and InP, in "A novel technique for the preservation of gratings in InP and InGaAsP and for the simultaneous preservation of InP, InGaAs, and InGaAsP in OMCVD," Journal of *Crystal Growth*, volume 107, 1991, pp. 871–877. That article disclosed that neither InP nor InGaAs is stable in arsine or phosphine respectively. Thus, when GaAs is grown on GaInP, the conventional technique of immediately substituting arsine for phosphine is likely to produce an intermediate layer of GaInAsP of graded composition and having an uneven surface. Such a layer can have a lower bandgap than GaAs and so will capture free charge carriers, principally heavy holes. Therefore, recombination occurs close to the interface where the material's wavelength is longer than desired. Furthermore, the efficiency is likely to be reduced because of nonradiative centers arising from the interfacial roughness. Also, the graded composition smears the interface, a critical problem when the GaAs layer is thin so as to serve as a quantum-well layer. That reference also suggested that $As_4$ rather than $As_2$ should be used to preserve InP during its heat up before growth.

SUMMARY OF THE INVENTION

The invention can be summarized as a method of stabilizing the interface between a III-V semiconductor layer containing P and a III-V semiconductor layer containing As grown over it. Instead of simply switching the P to As, an atomically thin capping layer is grown which contains P, for which any reaction with the growth reactant for the As is non-deleterious. Preferably, the capping layer should have a wide bandgap and have a higher bond strength than the overgrown layer. For InAlAs grown on InP, an AlP capping layer is interposed. For GaAs grown on GaInP, a GaP capping layer is interposed.

DETAILED DESCRIPTION OF THE PREFERRED EMBODIMENTS

Figure 1:
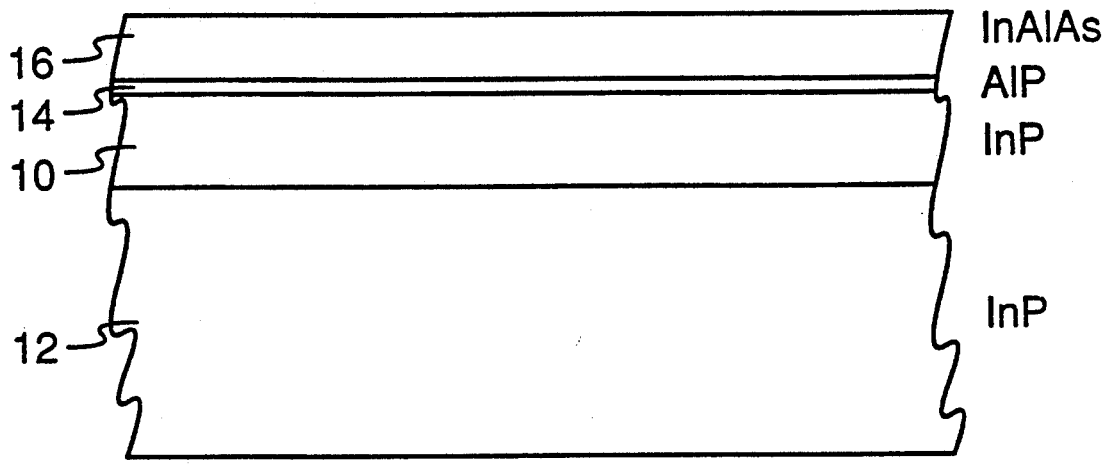
FIG. 1 is a cross-section of a first embodiment of the invention including an aluminum stabilized interface in which InAlAs is grown on InP.

A first preferred embodiment of the invention is illustrated in cross-section in FIG. 1. An InP epilayer 10 is epitaxially deposited on an InP substrate 12. A very thin AlP capping layer 16 is epitaxially deposited on the InP epilayer 10. An InAlAs layer 16 is epitaxially deposited on the AlP capping layer 14. The AlP is more refractory than the InP and then any As-P exchange from the InAlAs, during growth or use, occurs only in a non-deleterious way.

The capping layer 14 should possess several characteristics. It need not be lattice matched to the underlying layer 10, but it should be of sufficient thinness that it is pseudomorphic to that layer 10. This means that when the capping layer is epitaxially formed on its substrate, its lattice spacing within the layer plane matches the growth substrate. Beyond a critical pseudomorphic thickness, dislocation defects form which allow any further growth to assume its natural or bulk lattice spacing. A pseudomorphically thin capping layer 14 allows the epitaxy of relatively thick layers 10 and 16 of lattice matching composition and separated by the non-lattice-matched capping layer 14. The capping layer should have a thickness of at least a binary monolayer to provide the chemical isolation of the underlying layer, but thickness of more than ten monolayers may cause undesired degrading of the heterojunction interface. The capping layer 14 should be composed of a material having a larger bandgap than the associated active layer 16 to prevent charge capture. In order to stabilize the interface, the atomic bonding strength of the compound constituents of the capping layer 14 should be larger than those formed in the underlying layer. For an InP substrate, the P bonds more strongly with the Al anion than with the In anion. A high heat of formation indicates a large bonding strength. An atomically thin layer of AlP satisfies all these criteria when over grown with InAlAs.

EXAMPLE 1

Figure 2:
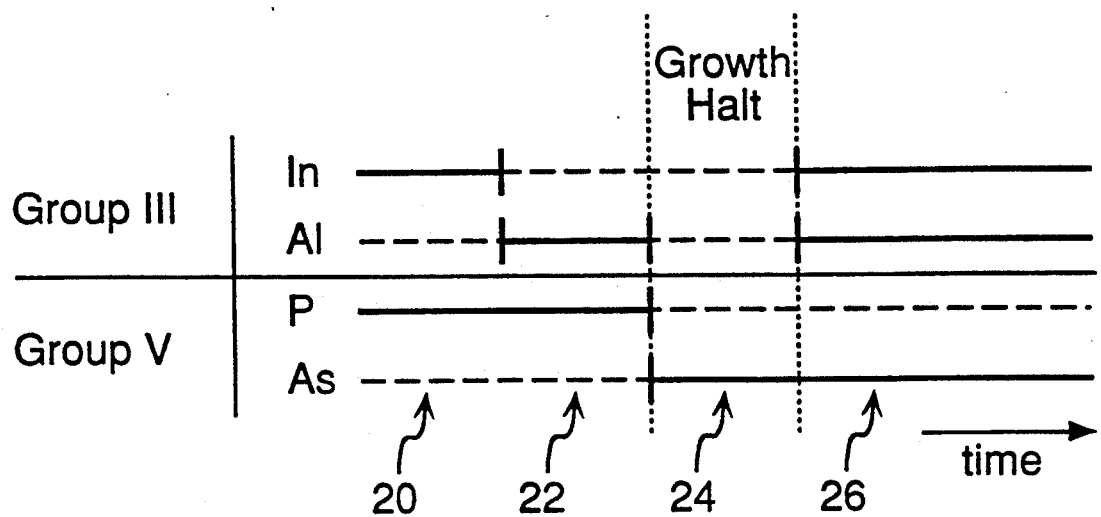
FIG. 2 is a sequencing chart illustrating the timing in the supply of precursors according to the invention in the fabrication of the structure of FIG. 1.

An example of the invention was grown using the timing chart given in FIG. 2. The structure of FIG. 1 was grown by OMMBE using a Vacuum Generators V80H gas source MBE. Trimethyl-indium (TMI) and tri-isobutyl-aluminum (TIBAl) were supplied from gas sources as the group-V precursors. Cracked arsine and phosphine were supplied from gas sources as the group-III precursors in the form of $As_2$ and $P_2$. All sources were selectively masked to change the composition of the deposited material. The substrate temperature was preferably held between 480 and 520 C during growth.

The InP substrate 10 was vicinally oriented at 2° off the (100) surface toward (011) and was doped n+ with S. Alternatively, it could be doped with Fe to be semi-insulating. The InP buffer layer 12 was grown to a thickness of about 100 nm during a first deposition step 20 during which the In and P sources were turned on. Then, the AlP stabilization layer 14 was deposited in a second deposition step 22 in which the In anion source was turned off, the Al anion source was turned on, and the P cation source continued on. The second step 22 continued for about 10 seconds so that the AlP formed to a thickness of about a binary monolayer. In a growth halt 24, the In, Al, and P sources were all turned off, but the As source was turned on. During the growth halt 24, the growth chamber was purged of P and filled with As, but no mixed growth occurred because of the absence of In and Al. A 2-sec growth halt 24 seemed satisfactory although longer halts did not degrade the structure. The InAlAs layer 16 was grown in a fourth deposition step during which both the In and Al anion sources were turned on in a desired ratio and the As source remained on. The $In_xAl_{1-x}As$ composition was chosen to be x=0.52 so that the InAlAs was nearly lattice matched to InP. The monolayer thickness of the AlP layer 14 is an extreme of a pseudomorphic thickness for which the AlP, although having a bulk lattice constant different from InP, is epitaxially deposited in a sufficiently thin layer that its lattice spacing within the layer plane matches the InP on which it is grown. Beyond a critical pseudomorphic thickness, dislocation defects form which allow the overlayer to assume its bulk lattice spacings. The capping layer 14 can have a thickness of more than a monolayer, but thicknesses of more than ten binary monolayers may cause an undesired degrading of the heterojunction interface.

Photoluminescence data were obtained at 4K from both the inventive structure and a conventional structure without the AlP stabilization layer 14, that is, fabricated without deposition step 22. The AlP layer 14 increased energy of the emission peak by a few tens of meV over a structure grown without it. Increasing the growth halt after the AlP formation from 2 s to 8 s changed the results insignificantly. Importantly, an increase in the growth halt in the conventional structure substantially degraded the photoemission peak, significantly decreasing the emission energy, and indicating a degradation of the interface, which appears to be due to As-P exchange.

Figure 3:
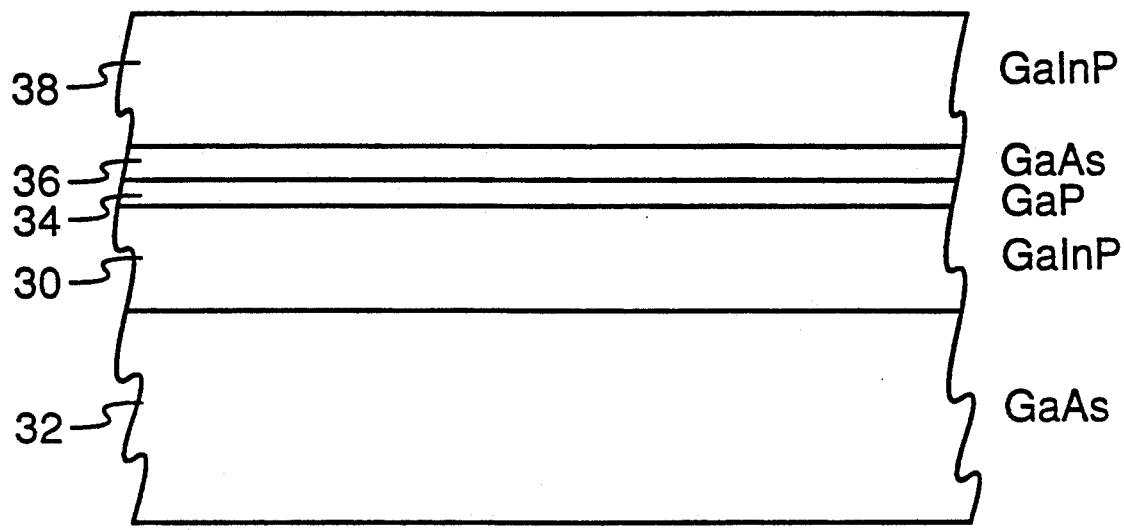
FIG. 3 is a cross-section of a second embodiment of the invention including a quantum-well structure having a capping layer between GaAs grown on GaInP.

The invention may also be applied to the OMCVD growth of GaAs/GaInP heterostructures. In a second preferred embodiment illustrated in cross section in FIG. 3, a GaAs quantum-well structure includes a lower barrier layer 30 of GaInP lattice matched to a GaAs substrate 32. An extremely thin capping layer 34 of GaP is interposed between the GaInP barrier layer 30 and a thin quantum-well layer 34 of GaAs. The quantum-well structure is completed with a top GaInP barrier layer 38. A GaP capping layer is not required when the GaInP of the top barrier layer 38 is grown over the GaAs quantum-well layer 36 although it could be readily added.

Figure 4:
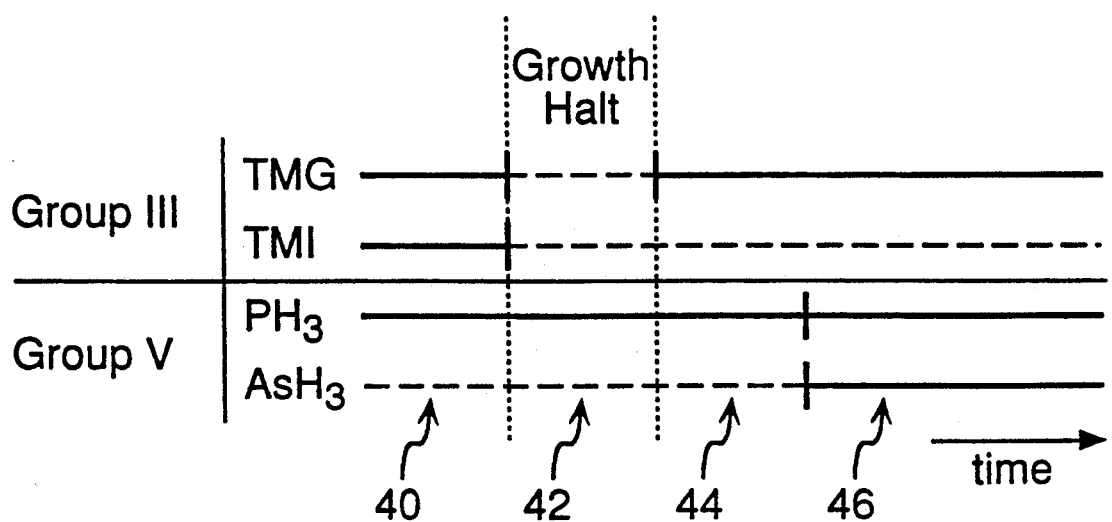
FIG. 4 is a sequencing chart illustrating the timing in the supply of precursors according to the invention in the fabrication of the structure of FIG. 3.

The growth sequence for the second embodiment is illustrated in FIG. 4. A first deposition step 40 supplies TMG, TMI, and phosphine into the OMCVD reaction chamber to form the GaInP barrier layer. In a growth halt 42, both the TMG and TMI are interrupted. A second deposition step 44 forms the few monolayers of the GaP capping layer by again supplying TMG but not TMI. During these steps 40, 42, and 44, phosphine is supplied without interruption. A third deposition step 46 forms the GaAs quantum-well layer by stopping the phosphine and supplying arsine. Any reaction at the interface between the GaP and arsine would produce GaAsP, which has a higher bandgap than the GaAs, thus not affecting the quantum confinement. A growth halt is not required while substituting arsine for phosphine between steps 44 and 46.

EXAMPLE 2

A superlattice structure was fabricated with many periods of a GaInP barrier layer and a GaAs quantum-well layer. The interface transitioning from GaInP to GaAs, however, followed the quantum-well structure of FIG. 3. The superlattice was grown by OMCVD at low pressure following the procedures of the Bhat et al. article. The GaAs substrate had a (001) orientation. The barrier layers of $Ga_xIn_{1-x}P$ had an alloying fraction of 0.515. The capping layer of GaP is estimated to have had a thickness of about 0.8 nm, that is, about about three monolayers. The quantum-well layers had a thickness of 13 nm.

The structure of the invention was then tested for photoluminescence. It displayed a single peak at an energy close to that predicted for that sized quantum well. In comparison, when the structure was grown without the GaP capping layer so that a graded interfacial layer of InGaAsP was formed, photoluminescence exhibited peaks of lower energy than expected. The energy spacings in conventional structures between heavy-hole and light-hole radiative transitions varied, indicating degraded interfaces. Furthermore, when the inventive and comparative samples were measured for X-ray rocking curves, the satellite peaks were extremely sensitive upon the switching sequence.

The invention thus provides for an improved heterojunction between InP and InAlAs or GaAs and GaInP with only minor modification of the growth sequencing. The superior heterojunction provides significantly improved quantum effects.

What is claimed is:

1. A III-V semiconductor heterostructure comprising:
   a first layer having a first III-V semiconductor composition including a first group III element and phosphorous;
   an atomically thin capping layer formed over said first layer and having a second III-V semiconductor composition including a second group III element and phosphorous but not arsenic, said capping layer being of sufficient thinness to be pseudomorphic to said first layer and of sufficient thickness to provide chemical isolation of said first layer; and
   a second layer formed in contact with said capping layer and having a third semiconductor composition including said second group III element and arsenic but substantially no phosphorous;
   whereby said capping layer is a transition layer between the phosphide first layer and the arsenide second layer, and wherein said capping layer is not lattice matched to both of said first and second layers.

2. A III-V semiconductor heterostructure comprising:
   a first layer having a first III-V semiconductor composition including indium and phosphorous;
   an atomically thin capping layer formed over said first layer and having a second III-V semiconductor composition including a group III element and phosphorous but substantially no indium, said capping layer being of sufficient thinness to be pseudomorphic to said first layer and of sufficient thickness to provide chemical isolation of said first layer; and
   a second layer formed in contact with said capping layer and having a third semiconductor composition including said group III element and arsenic but substantially no phosphorous;
   whereby said capping layer is a transition layer between the phosphide first layer and the arsenide second layer.

3. A heterostructure as recited in claim 2, wherein said first composition comprises indium phosphide said second composition comprises aluminum phosphide, and said third composition comprises indium aluminum arsenide, whereby said group III element comprises aluminum.

4. A heterostructure as recited in claim 2, wherein said first composition comprises gallium indium phosphide, said second composition comprises gallium phosphide, and said third composition comprises gallium arsenide, whereby said group III element comprises gallium.

5. A III-V semiconductor heterostructure comprising:
   a first layer having a first III-V semiconductor composition including a first group III element and phosphorous;
   an atomically thin capping layer formed over said first layer and having a second III-V semiconductor composition including a second group III element and phosphorous, said capping layer having a thickness of less than ten monolayers so as to be of sufficient thinness to be pseudomorphic and being of sufficient thickness to provide chemical isolation of said first layer; and
   a second layer formed in contact with said capping layer and having a third semiconductor composition including said second group III element and arsenic but substantially no phosphorous;
   whereby said capping layer is a transition layer between the phosphide first layer and the arsenide second layer.

6. A heterostructure as recited in claim 1, wherein said second composition has a larger semiconductor bandgap than said third composition.

7. A heterostructure as recited in claim 1, wherein phosphorous bonds atomically more strongly to said second group III element than to said first group III element.

* * * * *